United States Patent [19]

Qi et al.

[11] Patent Number: 5,221,526
[45] Date of Patent: Jun. 22, 1993

[54] PRODUCTION OF SILICON CARBIDE WHISKERS USING A SEEDING COMPONENT TO DETERMINE SHAPE AND SIZE OF WHISKERS

[75] Inventors: Dongxin Qi, Placentia; Roy T. Coyle, Yorba Linda; Richard D. Tait, Fullerton; Rick J. Orth, Diamond Bar, all of Calif.

[73] Assignee: Advanced Industrial Materials, Yorba Linda, Calif.

[21] Appl. No.: 705,089

[22] Filed: May 24, 1991

[51] Int. Cl.$^5$ ............................................. C01B 31/36
[52] U.S. Cl. ........................... 423/345; 156/DIG. 112
[58] Field of Search .................. 423/345, 346; 501/88, 501/92; 156/DIG. 64, DIG. 112

[56] References Cited

U.S. PATENT DOCUMENTS

| | | | |
|---|---|---|---|
| 3,778,296 | 12/1973 | Thalmann et al. | 423/345 |
| 4,248,844 | 2/1981 | Ramsey, Jr. et al. | 423/345 |
| 4,283,375 | 8/1981 | Horne, Jr. et al. | 423/345 |
| 4,492,681 | 1/1985 | Endou et al. | 423/345 |
| 4,500,504 | 2/1985 | Yamamoto | 423/345 |
| 4,504,453 | 3/1985 | Tanaka et al. | 423/345 |
| 4,606,902 | 8/1986 | Ritter | 423/345 |
| 4,690,811 | 9/1987 | Kida et al. | 423/345 |
| 4,839,150 | 6/1989 | Coyle et al. | 423/345 |
| 4,849,196 | 7/1989 | Yamada et al. | 423/345 |
| 4,873,069 | 10/1989 | Weaver et al. | 423/345 |
| 4,904,622 | 2/1990 | Duboto et al. | 501/88 |
| 4,948,573 | 8/1990 | Wadkarni et al. | 423/291 |
| 5,037,626 | 8/1991 | Ho et al. | 423/345 |

FOREIGN PATENT DOCUMENTS

| | | | |
|---|---|---|---|
| 0179670 | 4/1986 | European Pat. Off. | |
| 0370687 | 5/1990 | European Pat. Off. | |
| 1132509 | 6/1986 | Japan | 423/345 |
| 2229799 | 9/1990 | Japan | 156/DIG. 112 |
| 2116533 | 9/1983 | United Kingdom | 423/345 |

OTHER PUBLICATIONS

J. V. Milewski, F. D. Gac, J. J. Petrovic and S. R. Skaggs, "Growth of Beta-Silicon Carbide Whiskers by the VLS Process," *J. Materials Science*, vol. 20, 1985, pp. 1160-1166.

M. A. Janney, G. C. Wei, C. R. Kennedy and L. A. Harris, "Carbothermal Synthesis of Silicon Carbide," Report ORNL-6169, Oakridge National Laboratory, Oak Ridge, Tenn., May 1985.

*Primary Examiner*—Olik Chaudhuri
*Assistant Examiner*—Ken Horton
*Attorney, Agent, or Firm*—Walter A. Hackler

[57] ABSTRACT

A process for producing silicon carbide whiskers in which a particulate form of carbon is combined with a silicon component, a boron component and seeding component to form a mixture which is then subjected to temperatures above about 1300° C. in a nonoxidizing atmosphere such that carbon reacts with silica to form silicon carbide whiskers. The preferred particulate carbon, silicon component, boron component and seeding component are, respectively, carbon black, fumed silica, boron oxide and cobalt, iron or nickel. The size and shape of the whiskers can be controlled by varying the size of the seeding component and the concentration of the boron component.

41 Claims, 4 Drawing Sheets

PRODUCTION OF SILICON CARBIDE WHISKERS USING A SEEDING COMPONENT TO DETERMINE SHAPE AND SIZE OF WHISKERS

BACKGROUND OF THE INVENTION

This invention relates to a process for making silicon carbide whiskers and is particularly concerned with a process for providing relatively high yields of beta silicon carbide whiskers while controlling the size and shape of the whiskers.

Silicon carbide is a high strength ceramic material which has good chemical stability and excellent oxidation resistance to high temperatures due mainly to covalent bonding and a crystal structure related to that of diamond. Silicon carbide whiskers are needle-shaped single crystals of silicon carbide having an aspect ratio, i.e., a length-to-diameter ratio, greater than about 3 and a typical diameter between about 0.1 and 10 microns. The high aspect ratio of whiskers makes them a much more effective reinforcement in composites, especially ceramic matrix composites, than silicon carbide particulates. Also, whiskers exhibit much higher mechanical strength than silicon carbide fibers, which are either polycrystalline or amorphous forms of silicon carbide that typically have a diameter greater than 10 microns. These superior properties of silicon carbide whiskers have led to their use as a reinforcing material for ceramics, metals, polymers and glass composites. Silicon carbide whiskers are particularly suited for use in the reinforcement of all types of engineering ceramics including gas turbine ceramics, automotive ceramics and ceramic cutting tools. It is estimated that the market for the use of whiskers as reinforcements for engineering ceramics alone will be several hundred million dollars per year by the year 2000.

When silicon carbide whiskers are used as reinforcement in composites, it is preferable that the size and shape of the whiskers meet specified requirements. For example, in some instances it may be desirable that the diameter of the whiskers be less than one micron while in other cases whisker diameters of several microns are preferred. Also, straight whiskers are normally used to reinforce ceramic matrix composites because such reinforced composites have a higher fracture toughness than those reinforced with curly whiskers. On the other hand, curly whiskers may be more effective than straight whiskers for other reinforcing applications. For these and other reasons, it is desirable that the size and shape of the whiskers be controlled during synthesis.

The current dominant technology for producing silicon carbide whiskers is the carbothermal reduction of silica by carbon in rice hulls. Rice hulls are composed of about 15 to 20 percent ash that is primarily silica. Thus, when the rice hulls are retorted or pyrolyzed in an inert atmosphere at a temperature in the vicinity of 1800°C. while removing gases and other vapors as they form, carbon in the rice hulls reacts with silica to form silicon carbide in accordance with the overall reaction of

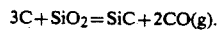

$3C + SiO_2 = SiC + 2CO(g)$.

The major problem with using rice hulls to synthesize silicon carbide whiskers is that the resultant product normally contains only between about 10 and 20 weight percent silicon carbide whiskers with the remainder being silicon carbide in the form of particulates, unreacted silica and unreacted carbon. Higher yields of silicon carbide whiskers are usually not possible because the chemical composition of the rice hulls and the degree of mixing of the carbon and silica therein are set by nature and cannot readily be varied. Thus, it is difficult to obtain an intimate mixture of carbon and silica that is sufficiently porous to allow carbon monoxide gas to escape and thereby drive the overall reaction of carbon with silica to form silicon carbide to completion while allowing space for silicon carbide whiskers to grow.

It can be seen from the above that future processes for producing silicon carbide whiskers should give a relatively high yield of whiskers having desired sizes and shapes which can be tailored according to the particular use desired for the whiskers.

SUMMARY OF THE INVENTION

In accordance with the invention, it has now been found that high yields of silicon carbide whiskers can be obtained from mixtures of (1) a particulate form of carbon, (2) a silicon component selected from the group consisting of silica, hydrated silica and a source of silica, (3) a boron component, and (4) a seeding component comprising an element selected from the group consisting of the rare earths, Group IA, Group IB, Group VB, Group VIB, Group VIIB, and Group VIII of the Periodic Table of Elements, or a compound containing one or more of these elements. Upon the heating of these mixtures at temperatures sufficient to induce a reaction between carbon and silica, temperatures normally above 1300°C. and preferably between 1500° and 1800° C., carbon and silica in the mixture react to form high yields of silicon carbide whiskers having the beta crystal structure. Carbon black is a preferred form of carbon while fumed silica is a preferred silicon component and boron oxide a preferred boron component. The seeding component usually contains an element or elements selected from the group consisting of lithium, potassium, sodium, rubidium, neodymium, niobium, vanadium, tantalum, chromium, molybdenum, manganese, iron, ruthenium, cobalt, rhodium, nickel, palladium and copper. Preferably, the seeding component is cobalt, nickel or iron, or compounds containing these metals.

The size and shape of the whiskers formed in the process of the invention are controlled by the size of the seeding component and the concentration of the boron component. The use of seeds having a weight average particle size between about 0.1 and 3.0 microns results in the production of predominantly curly whiskers at relatively low concentrations of the boron component. As the concentration of the boron component increases, the amount of curly whiskers in the synthesis product decreases. The use of seeds having a weight average particle size between about 3.0 and 200 microns tends to yield a high concentration of whiskers having a relatively straight shape when the boron component is present in sufficient quantity so that the mixture subjected to the high temperature synthesis step has a mole ratio of boron-to-silicon greater than about 0.20 and less than about 0.80. In both of these embodiments of the invention, the diameters of the whiskers can vary between 0.1 and 3.0 microns with a 1 micron diameter being somewhat typical.

The process of the invention described above, by utilizing a boron component in combination with a seeding component to promote whisker growth during the reaction of carbon with silica, is much more efficient than the retorting of rice hulls in selectively producing silicon carbide whiskers. Furthermore, since the size and shape of the whiskers can be controlled by varying the size of the seeding component and the concentration of the boron component, whiskers can be tailor-made for particular applications.

DETAILED DESCRIPTION OF THE INVENTION

Figure 1:
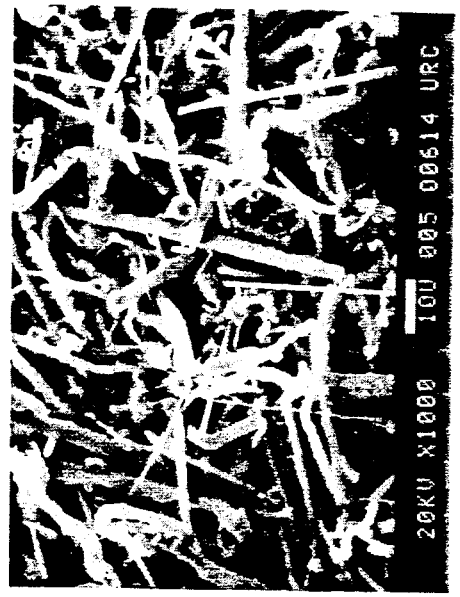
FIG. 1 in the drawing is a scanning electron photomicrograph, at 900 times magnification, of the product formed in Example 1 illustrating the formation of silicon carbide whiskers by heating in a nonoxidizing atmosphere a mixture of carbon black, fumed silica, cobalt metal having a weight average particle size of about 1.6 microns, and boron oxide powder in concentrations such that the mixture has a boron-to-silicon mole ratio of 0.11.

Silicon carbide whiskers of desired size and shape are produced in accordance with the process of the invention by combining a particulate form of carbon with a silicon component, a boron component and a seeding component to form a mixture, heating the resultant mixture in a nonoxidizing atmosphere at temperatures sufficiently above about 1300° C. to induce the reaction of carbon with silica to form silicon carbide whiskers and recovering a product containing the silicon carbide whiskers.

The particulate form of carbon used in the process of the invention can be any form of carbon that has a rather fine particle size and a relatively high specific surface area. Normally, the weight average particle size of the carbon source is between about 1 and 1,000 nanometers, preferably between about 5 and 100 nanometers, while the surface area usually ranges between about 100 and 600, preferably between about 200 and 500, square meters per gram. The particulate carbon can be in any form that gives the desired surface area and particle size. The various forms of carbon black, such as furnace black and acetylene black, are normally preferred since they usually have the requisite particle sizes and surface areas. However, other forms of carbon such as activated carbon, graphite powder and even petroleum coke can be used if they have the appropriate physical properties. Usually, an amorphous form of carbon is preferred over a crystalline form because amorphous carbon typically has a smaller particle size, a higher surface area and a higher reactivity.

The silicon component used to form the mixture which is converted at high temperatures into silicon carbide may be any crystalline or amorphous form of silica, a hydrated silica or a source of silica, i.e. a silicon-containing compound which decomposes into silica during the heating step. Typically, the forms of silica have a surface area between about 50 and 500, preferably between 100 and 400, square meters per gram. Examples of different types of silica which may be used are high surface area materials such as fumed silica and silica glass powder. The use of silica having a weight average particle size less than about 1.0 micron is preferred since smaller particles generally promote a more rapid reaction. In general, the weight average particle size of the silica is between about 1 and 100 nanometers, preferably between 5 and 50 nanometers. Examples of hydrated silicas which may be used in the process of the invention include silicic acid, silica sols and silica gels while examples of the sources of silica that can be used include silicon alkoxides, such as tetraethoxy and tetramethoxy orthosilicates, and other types of silanes.

Typically, sufficient amounts of the particulate carbon and silicon component are utilized in forming the mixture subjected to the high temperature silicon carbide synthesis step so that the carbon-to-silicon mole ratio in the mixture ranges between 2.0 and 6.0, preferably between 2.5 and 5.0, and most preferably between about 3.0 and 4.0. It is normally preferred that a stoichiometric excess of the particulate carbon be utilized.

The boron component used in the process of the invention is preferably boron oxide $B_2O_3$) or an inorganic boron compound, such as boric acid ($H_3BO_3$), which decomposes to boron oxide at or below the silicon carbide synthesis temperatures utilized. Also, organoboron compounds which decompose to boron oxide may be used. It is believed that the boron component enhances whisker growth by forming a low temperature melt with silica, i.e., a borosilicate melt, during the high temperature synthesis step, which melt spreads or coats the surface of the carbon particles, thereby resulting in better contact of carbon and silica and thus better reaction kinetics. Also, the melt surrounding the carbon particles serves as a medium in which the whiskers can grow as opposed to prior art methods of making whiskers where there is no substantial liquid phase present, and whisker growth is inhibited by a solid environment. Examples of organoboron compounds which may be used in the process of the invention include trimethyl borate [$(CH_3O)_3B$], triethyl borate [$C_2H_5O)_3B$], triisopropyl borate [$(C_3H_2O)_3B$] and other boron alkoxides. In general, a sufficient amount of the boron component is used so that the mole ratio of boron-to-silicon in the mixture subjected to heating to form silicon carbide whiskers is between about 0.15 and 1.0, preferably between about 0.20 and 0.80.

The fourth and final component of the mixture which is heated to form silicon carbide whiskers in accordance with the process of the invention is a seeding component which, in essence, serves as a catalyst for the production of the silicon carbide whiskers. The seeding component typically contains an element or elements selected from the group consisting of the rare earths, Group IA, Group IB, Group VB, Group VIB, Group VIIB, and Group VIII of the Periodic Table of Elements. As used herein "Period Table of Elements" refers to the version commonly used in the United States and approved by Chemical Abstracts (CAS). An example of such a table may be found on the inside front cover of the *CRC Handbook of Chemistry and Physics,* 69th edition, which was edited by R. C. Weast and was published in 1988 by CRC Press, Inc., Boca Raton, Fla. Preferably, the seeding component contains lithium, potassium, sodium, rubidium, neodymium, niobium, vanadium, tantalum, chromium, molybdenum, manganese, iron, ruthenium, cobalt, rhodium, nickel, palladium, copper and combination thereof.

The seeding component used is preferably in the form of a metal or mixture of metals, i.e. an alloy, but, if desired, a compound or a mixture of compounds containing the desired element or elements may be used. It has been found that the use of cobalt, nickel and iron metal as the seeding component or compounds containing cobalt, nickel or iron are particularly effective in producing a product containing high concentrations of silicon carbide whiskers. When the seeding component is a compound, it is typically in the form of an oxalate, a carbonate, a silicide, a carbide, a sulfide, a nitrate, a nitride, an oxide, a boride, a silicate, a sulfate, a phosphide, a phosphate or a halide with compounds in the form of an oxide, a carbonate or a nitrate being preferred. In general, a sufficient amount of the seeding component is used such that the mole ratio of the desired element in the seeding material to the silicon present in the mixture that is subjected to heating is between about 0.001 and 0.30, preferably between about 0.003 and 0.20, and more preferably between 0.01 and 0.15.

After the mixture of the particulate carbon, the silicon component, the boron component and the seeding component is formed, it is subjected to temperatures sufficiently high to cause silica to react with carbon in the mixture and thereby form silicon carbide via the carbothermal reduction of silica by carbon. These temperatures are typically above 1300° C. and usually range between about 1300° C. and 2000° C., preferably between about 1400° and 1900° C., and most preferably between about 1500° C. and 1800° C. The higher the temperature, the more rapid is the formation of silicon carbide. However, at temperatures above about 2,000° C., silicon carbide is transformed from the beta to the alpha crystal form. Thus, temperatures of this magnitude should be avoided when attempting to produce silicon carbide whiskers having the beta crystal structure.

The mixture subjected to these high silicon carbide synthesis temperatures is normally formed by utilizing a commercial blender in order to obtain a thorough and intimate mixture of the four components. The resultant bulk density of the mixture is usually relatively low, especially when carbon black is used as the particulate form of carbon and fumed silica as the silicon component, because of the relatively high surface areas of the particulate carbon and silica component. Although this low bulk density provides an ideal environment for the growth of high quality silicon carbide whiskers, it also reduces the amount of feed that can be processed per unit of time. Thus, it is normally preferred to subject the blended mixture to a vacuum in order to remove excess air and increase the bulk density. This can be done by either pulling a vacuum on the blender or mixing device itself or in a separate vessel after the mixing has been completed. The vacuum used is normally equivalent to between 25 and 29 inches of mercury applied for between 1 and 10 minutes.

The high temperature synthesis or carbothermal reduction step may be carried out in a batch-type or continuous operation normally in the presence of a substantially nonoxidizing atmosphere. Preferably, a flowing gas atmosphere is utilized to remove product carbon monoxide which, if present in high concentrations, would shift the reaction equilibrium away from the formation of silicon carbide. Normally, this high temperature carbothermal reduction step is carried out at atmospheric pressure. If a batch-type operation is preferred, the mixture may be heated inside a covered graphite container in an induction or resistance furnace. Alternatively, if a continuous operation is desired, the mixture may be passed through a rotary kiln or other high temperature heating device. In general, the heating takes place in a device which is devoid of trays and contains no substrate surface for whisker growth.

In addition to silicon carbide whiskers, the product formed in the high temperature synthesis or carbothermal reduction step may, depending upon the initial concentration of the reactants, contain silicon carbide particulates, unreacted seeding component, unreacted silica, borosilicate glass produced by the solidification of the residual borosilicate melt formed by the reaction of boron with silica at synthesis temperatures, and small amounts of the boride and silicide of the metal comprising the seeding component. Also, in some cases, unreacted carbon will be present. This product is typically treated to separate the silicon carbide whiskers from these impurities. The actual treatment procedures utilized depends upon the purity of silicon carbide whiskers desired. In most cases, the raw product is subjected to air classification methods, such as elutriation, which are widely employed in the chemical processing industry for classifying solid particles. This procedure will normally remove the larger particles of silicon carbide particulates and borosilicate glass along with any residual seeding component that remains. If the remaining silicon carbide whiskers are still not of the desired purity, a second step comprising a hydrofluoric acid and/or aqua regia wash can be used to dissolve residual silica, borosilicate glass and other impurities that could not be removed by air classification. Finally, if excess carbon is present in the product from the carbothermal reduction step, it can be combusted in an oxygen-containing atmosphere at moderate temperatures usually ranging between 500° and 700° C. to form gaseous products.

The process of the invention is based, at least in part, on the discovery that the use of both a boron component and a seeding component results in a very high yield of silicon carbide whiskers, typically greater than about 50 weight percent and usually greater than about 80 to 95 weight percent of the product. It has been unexpectedly discovered that the size and shape of the resultant whiskers can be controlled by the size of the seeding component utilized, and, in some cases, the concentration of the boron component. It has been found that curly whiskers normally result when the seeding component has a relatively small size and the boron concentration is relatively low whereas straight whiskers can be obtained by using a larger size seeding component and a broad range of boron concentrations. Typically, if curly shaped whiskers are desired, the seeding component has a weight average particle size between about 0.10 and 3.0 microns, preferably between about 0.50 and 2.0 microns. On the other hand, if straight whiskers are desired, the weight average particle size of the seeding component normally ranges between about 3.0 and 200 microns, preferably between about 5.0 and 100 microns, and more preferably between 10 and 60 microns.

It has been observed that the effective concentrations of the boron component in the mixture subjected to the high temperature synthesis step of the process of the invention depends somewhat on the size of the seeding component used. Generally, a higher concentration of boron is required with larger seeding components while lower concentrations are satisfactory when the seeding component is smaller in size. When the weight average particle size of the seeding component ranges between 0.1 and 3.0 microns, the boron-to-silicon mole ratio in the mixture subjected to high temperature silicon carbide synthesis will typically range from about 0.20 to 0.90, preferably between about 0.30 and 0.70. When the weight average particle size of the seeding component ranges between about 3.0 and 200 microns in size, the boron-to-silicon mole ratio in the mixture will typically range between about 0.35 and 1.0, preferably between about 0.50 and 0.80.

In general, when a seeding component having a weight average particle size less than 3.0 microns is used in the silicon carbide synthesis process, greater than about 50, usually between 60 and 70, weight percent of the whiskers in the synthesis product is curly in shape. On the other hand, when a seeding component having a weight average particle size above 3.0 microns is used, greater than 80, usually somewhere between 90 and 95, weight percent of the synthesized whiskers is straight in shape. The whiskers produced, regardless of their shape, normally have a diameter ranging between about 0.1 and 3.0 microns with a typical diameter being about 1 micron. The aspect ratio normally ranges between about 10 and 150, frequently between 20 and 60 and typically about 50. Most of the whiskers produced are reasonably smooth.

The nature and objects of the invention are further illustrated by the following examples, which are provided for illustrative purposes only and not to limit the invention as defined by the claims. In Examples 1 through 8 the seeding component utilized was cobalt metal having a weight average particle size of about 1.6 microns. Each of these eight examples was conducted at a different concentration of boron to illustrate the effect of increased boron concentration on the resultant whiskers. Examples 9 through 16 were also conducted utilizing cobalt metal as the seeding component but the cobalt used had a much larger weight average particle size, i.e., between about 35 and 45 microns, and was present in a higher concentration. Also, the concentration of carbon in the mixture subjected to whiskers synthesis was higher than that used in Examples 1 through 8.

EXAMPLE 1

Silicon carbide whiskers were synthesized by adding 50 grams of Aerosil 380 fumed silica powder supplied by Degussa Corporation to 33 grams of FW 200 channel carbon black also supplied by Degussa Corporation. The fumed silica had a weight average particle size of about 7 nanometers and a specific surface area of about 380 square meters per gram. The carbon black had a weight average particle size of about 13 nanometers, a specific surface area of about 460 square meters per gram, and contained about 21 weight percent volatiles. The mixture of silica and carbon black was combined with 3.06 grams of boron oxide powder and 4.16 grams of elemental cobalt powder having a weight average particle size of about 1.6 microns. The resultant combination of the four components was mixed in a Waring commercial blender for about five minutes. The resultant powdery mixture was then subjected to a vacuum in the blender for five minutes to remove excess air and increase the bulk density of the mixture. The carbon-to-silicon mole ratio, the boron-to-silicon mole ratio and the cobalt-to-silicon mole in the mixture were, respectively, 2.6, 0.11 and 0.08. Approximately one-half of the material in the blender was then removed and placed in a 12-inch long graphite boat having a truncated circular cross section with an inside diameter of three inches. The boat was covered with a graphite lid having uniformly distributed holes to allow the escape of reaction product gas during the whisker synthesis step. The loaded graphite boat was placed into a horizontal graphite tube furnace which was roughly 180 inches long with a 48 inch hot zone followed by a water-cooled zone. The furnace hot zone was preheated to 1650° C. while argon was passed through the furnace to create an argon atmosphere. The boat was pushed 12 inches further into the furnace every 30 minutes. After the fourteenth push or seven hours, the boat was removed from the water-cooled zone of the furnace. (If a continuous synthesis process is desired, a new boat containing the four component feed mixture can be placed in the furnace every 30 minutes.) After the boat was removed from the furnace, the as-synthesized product in the boat was essentially at room temperature, appeared greenish in color, and was rather loose and spongy. X-ray diffraction analysis revealed that the product was primarily silicon carbide having the beta crystal structure. A scanning electron photomicrograph of a portion of the product at 900 times magnification is shown in FIG. 1. As can be seen, there is a relatively high concentration of particulate silicon carbide present in addition to the silicon carbide whiskers. Also, a large proportion of the whiskers is curly in shape.

EXAMPLE 2

Figure 2:
FIG. 2 is a scanning electron photomicrograph, at 1,000 times magnification, of the product formed in Example 2 illustrating the formation of silicon carbide whiskers by heating a mixture similar to that of Example 1 but having a boron-to-silicon mole ratio of 0.22.

The procedure of Example 1 was followed except that 6.44 grams of boron oxide powder were used, thereby giving a boron-to-silicon mole ratio in the mixture subjected to blending of 0.22. A scanning electron photomicrograph of a portion of the resultant product at 1,000 times magnification is shown in FIG. 2 and indicates that the silicon carbide particulate concentration has decreased with the increasing boron-to-silicon mole ratio while the concentration of whiskers has increased. The concentration of curly whiskers remained high.

EXAMPLE 3

Figure 3:
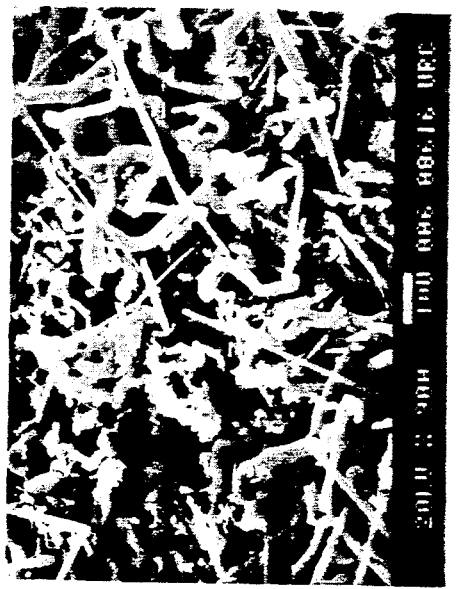
FIG. 3 is a scanning electron photomicrograph, at 1,000 times magnification, of the product formed in Example 3 illustrating the formation of silicon carbide whiskers by heating a mixture similar to that of Example 1 but having a boron-to-silicon mole ratio of 0.35.

The procedure of Example 1 was followed except that 10.24 grams of boron oxide powder were used, thereby giving a boron-to-silicon mole ratio in the mixture subjected to blending of 0.35. A scanning electron photomicrograph of a portion of the resultant product at 1,000 times magnification is set forth in FIG. 3 and shows that there is a much lower concentration of silicon carbide particulates and a higher concentration of whiskers in the product as compared to that obtained in Examples 1 and 2. Although a portion of the whiskers are still curly in shape, the concentration of these curly whiskers has decreased.

EXAMPLE 4

Figure 4:
FIG. 4 is a scanning electron photomicrograph, at 1,000 times magnification, of the product formed in Example 4 illustrating the formation of silicon carbide whiskers by heating a mixture similar to that of Example 1 but having a boron-to-silicon mole ratio of 0.50.

The procedure of Example 1 was followed except that 14.50 grams of boron oxide powder were used, thereby giving a boron-to-silicon mole ratio in the mixture subjected to blending of 0.50. A scanning electron photomicrograph of a portion of the resultant product at 1,000 times magnification is set forth in FIG. 4 and shows that, at this concentration of boron, there is a higher concentration of whiskers in the synthesized product as compared to that obtained in Examples 1 through 3. It also appears that the diameters of the whiskers are smaller than those of the whiskers made in the previous examples. The concentration of curly whiskers appears to have significantly decreased.

EXAMPLE 5

Figure 5:
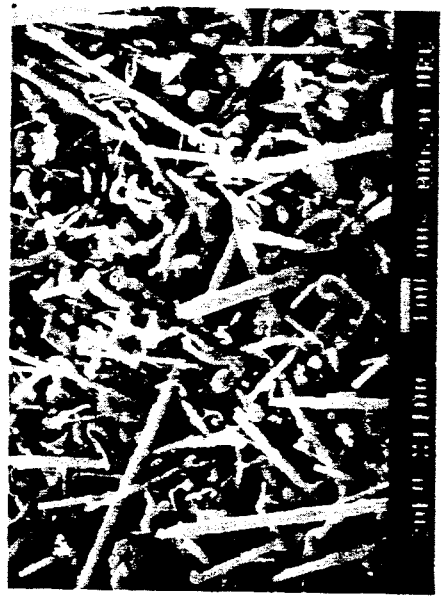
FIG. 5 is a scanning electron photomicrograph, at 1,000 times magnification, of the product formed in Example 5 illustrating the formation of silicon carbide whiskers by heating a mixture similar to that of Example 1 but having a boron-to-silicon mole ratio of 0.67.

The procedure of Example 1 was followed except that 19.34 grams of boron oxide powder were used so that the mixture subjected to blending had a boron-to-silicon mole ratio of 0.67. A scanning electron photomicrograph of a portion of the resultant product at 1,000 times magnification is shown in FIG. 5 and indicates the presence in the as-synthesized product of a low concentration of silicon carbide particulates and a high concentration of silicon carbide whiskers. As compared with the product obtained in Examples 1 through 4, the concentration of curly whiskers is relatively low.

EXAMPLE 6

Figure 6:
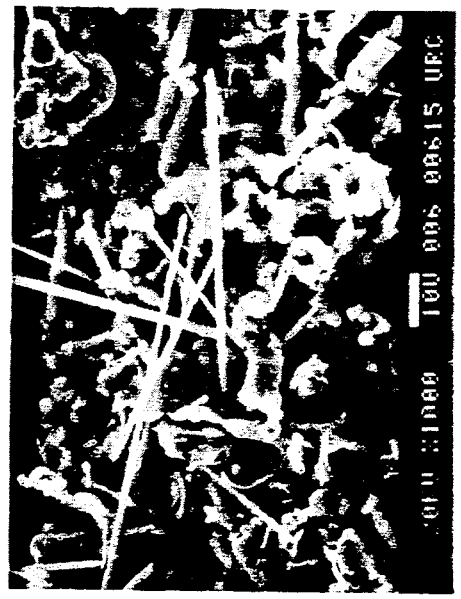
FIG. 6 is a scanning electron photomicrograph, at 1,000 times magnification, of the product formed in Example 6 illustrating the formation of silicon carbide whiskers by heating a mixture similar to that of Example 1 but having a boron-to-silicon mole ratio of 0.86.

The procedure of Example 1 was followed except that 24.86 grams of boron oxide powder were used so that the boron-to-silicon mole ratio in the mixture subjected to blending was 0.86. A scanning electron photomicrograph of a portion of the resultant product at 1,000 times magnification is set forth in FIG. 6 and shows the presence of a few rather large particles of material which were determined to be borosilicate glass. Because of the presence of this material in the as-synthesized product, the concentration of silicon carbide whiskers in the product decreased as compared to that in the product of Examples 4 and 5. Although the whiskers formed appear to be primarily straight in shape, a few curly whiskers are still present.

EXAMPLE 7

Figure 7:
FIG. 7 is a scanning electron photomicrograph, at 1,100 times magnification, of the product formed in Example 7 illustrating the formation of silicon carbide whiskers by heating a mixture similar to that of Example 1 but having a boron-to-silicon mole ratio of 1.08.

The procedure of Example 1 was followed except that 31.24 grams of boron oxide powder was used so that the mole ratio of boron-to-silicon in the mixture subjected to blending was 1.08. A scanning electron photomicrograph of a portion of the resultant product at 1,100 times magnification is shown in FIG. 7 and indicates, as compared to the product of Example 6, a much higher concentration of residual borosilicate glass and a significantly decreased concentration of silicon carbide whiskers. It appears from the figure that only a very small number of these whiskers are curly in shape.

EXAMPLE 8

Figure 8:
FIG. 8 is a scanning electron photomicrograph, at 1,000 times magnification, of the product formed in Example 8 illustrating the formation of silicon carbide whiskers by heating a mixture similar to that of Example 1 but having a boron-to-silicon mole ratio of 1.33.

The procedure of Example 1 was followed except that 38.66 grams of boron oxide powder was used so that the boron-to-silicon mole ratio in the mixture subjected to blending was 1.33. A scanning electron photomicrograph of a portion of the resultant product at 1,000 times magnification is shown in FIG. 8 and indicates that the product, when compared to that of Examples 1 through 7, contains a larger amount of borosilicate glass and fewer silicon carbide whiskers. It can therefore be concluded that the use of a boron component in concentrations as high as or higher than that used in this particular synthesis will result in significantly lower concentrations of silicon carbide whiskers in the as-synthesized product.

A comparison of FIGS. 1 through 8 reveals several trends which were confirmed by the use of an optical microscope at various magnifications. First, the concentration of curly shaped whiskers in the as-synthesized product tends to decrease as the boron concentration in the feed increases. Second, when the boron concentration is relatively low, i.e., a boron-to-silicon mole ratio below 0.22, the concentration of silicon carbide whiskers in the as-synthesized product is relatively low. However, the concentration of whiskers (1) increases as the mole ratio of boron-to-silicon increases from 0.11 to 0.35, (2) remains relatively constant at a boron-to-silicon mole ratio ranging between 0.35 and 0.67, and (3) then begins to decrease at boron-to-silicon mole ratios of 1.08 and higher because of the presence of significant amounts of borosilicate glass. Third, when the concentration of boron is low, i.e. below a boron-to-silicon mole ratio of 0.22, the amount of silicon carbide particulates in the as-synthesized product is relatively high but decreases as the concentration of boron increases. Finally, the diameter of the synthesized whiskers at boron-to-silicon mole ratios between 0.11 and 0.35 is relatively large, decreases as the boron-to-silicon mole ratio increases to between 0.35 and 0.67 and then increases at boron-to-silicon mole ratios of 0.86 and above.

EXAMPLE 9

Figure 9:
FIG. 9 is a scanning electron photomicrograph, at 1,000 times magnification, of the product formed in Example 9 illustrating the formation of silicon carbide whiskers by heating in a nonoxidizing atmosphere a mixture of carbon black, fumed silica, cobalt metal having a weight average particle size between about 38 and 45 microns, and boron oxide powder in concentrations such that the mixture has boron-to-silicon mole ratio of 0.11.

The procedure of Example 1 was followed except that the mixture subjected to blending was formed by combining 61.2 grams of the fumed silica with 49.1 grams of carbon black, 6.1 grams of elemental cobalt powder having a weight average particle size between about 38 and 45 microns instead of 1.6 microns as used in Examples 1 through 8, and 3.75 grams of boron oxide powder. The boron-to-silicon mole ratio, the carbon-to-silicon mole ratio and the cobalt-to-silicon mole ratio in the mixture subjected to blending were, respectively, 0.11, 3.2 and 0.10. Unlike in Example 1 where the as-synthesized product had a greenish color, the product of this example was yellowish, evidently because of the use of the larger size cobalt particles. A scanning electron photomicrograph of a portion of the product at 1,000 times magnification is shown in FIG. 9. As can be seen from the figure, there is a very high concentration in the as-synthesized product of silicon carbide particulates and a relatively low concentration of whiskers, all of which appear to have a very small diameter. There appears to be few if any whiskers having a curly shape; the vast majority of the whiskers are straight. By comparing FIG. 9 with FIG. 1, the photomicrograph resulting from a run at the same boron-to-silicon mole ratio but with much smaller cobalt particles, i.e., a weight average particle size of 1.6 microns versus 38 to 45 microns, it can be seen that the diameter and concentration of the resultant whiskers are much smaller than those of the whiskers produced in Example 1. Also, it appears that very few of the whiskers formed in this example have a curly shape while the majority of the whiskers formed in Example 1 are curly.

EXAMPLE 10

Figure 10:
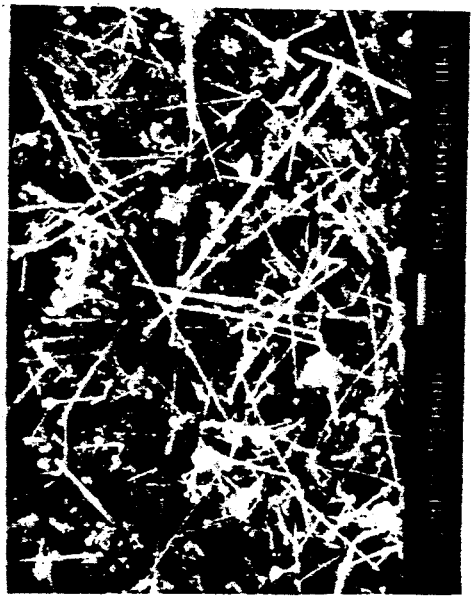
FIG. 10 is a scanning electron photomicrograph, at 1,000 times magnification, of the product formed in Example 10 illustrating the formation of silicon carbide whiskers by heating a mixture similar to that of Example 9 but having a boron-to-silicon mole ratio of 0.22.

The procedure of Example 9 was followed except that 7.88 grams of boron oxide powder were used so that the boron-to-silicon mole ratio in the mixture subjected to blending was 0.22. A scanning electron photomicrograph of a portion of the resultant silicon carbide-containing product at 1,000 time magnification is shown in FIG. 10. As compared to Example 9, it is seen that the concentration of silicon carbide whiskers in the as-synthesized product has increased while the concentration of silicon carbide particulates has decreased. A comparison of FIG. 10 with FIG. 2, the photomicrograph of a portion of the as-synthesized product obtained from a mixture containing the smaller size cobalt particles at the same boron-to-silicon mole ratio, shows (1) there are few if any curly whiskers in the product obtained using the larger cobalt particles, and (2) the concentration and diameter of the whiskers are somewhat less.

EXAMPLE 11

Figure 11:
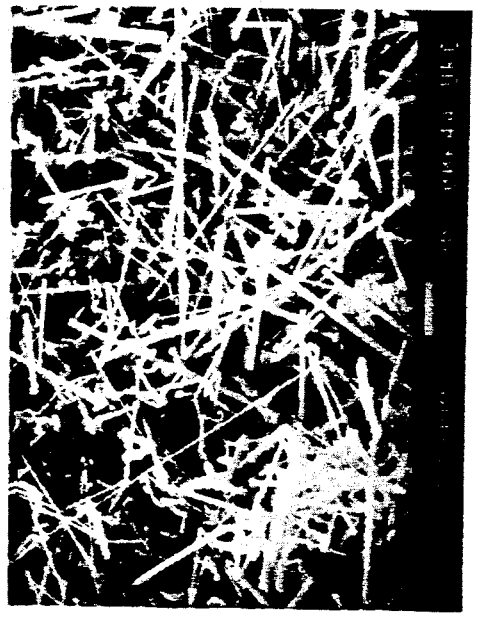
FIG. 11 is a scanning electron photomicrograph, at 1,000 times magnification, of the product formed in Example 11 illustrating the formation of silicon carbide whiskers by heating a mixture similar to that of Example 9 but having a boron-to-silicon mole ratio of 0.35.

The procedure of Example 9 was followed except that 12.53 grams of boron oxide powder were used so that the boron-to-silicon mole ratio in the mixture subjected to blending was 0.35. A scanning electron photomicrograph of a portion of the resultant product at 1,000 times magnification is shown in FIG. 11 and, when compared to FIG. 10, shows an increased concentration of silicon carbide whiskers in the as-synthesized product with a concomitant decreased concentration of silicon carbide particulates. A comparison of FIG. 11 with that of FIG. 3, the photomicrograph of the product formed utilizing the smaller size cobalt seeding particles at the same boron-to-silicon mole ratio, shows that the concentration of whiskers is about the same but the diameter of the whiskers formed using the larger seeds of this example is smaller. Also, few if any curly whiskers are present in the product of this example.

EXAMPLE 12

Figure 12:
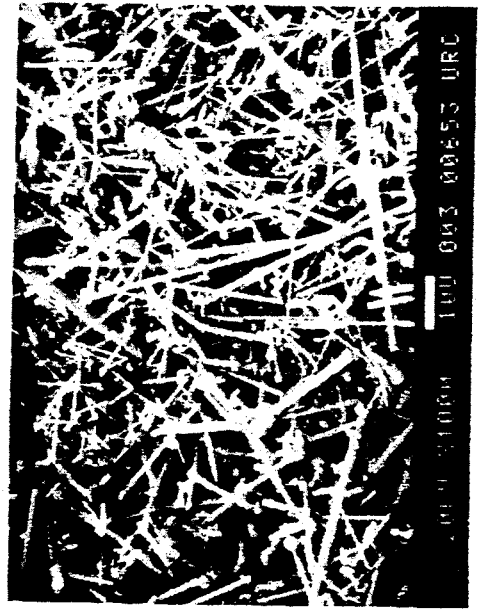
FIG. 12 is a scanning electron photomicrograph, at 1,000 times magnification, of the product formed in Example 12 illustrating the formation of silicon carbide whiskers by heating a mixture similar to that of Example 9 but having a boron-to-silicon mole ratio of 0.50.

The procedure of Example 9 was followed except 17.75 grams of boron oxide powder were used so that the boron-to-silicon mole ratio in the mixture subjected to blending was 0.50. A scanning electron photomicrograph of a portion of the resultant product at 1,000 times magnification is shown in FIG. 12 and, when compared to FIG. 11, indicates the presence of a higher concentration of whiskers than in the product of Example 11. It also appears that few, if any, curly whiskers are present; the vast majority are straight. When FIG. 12 is compared with FIG. 4, the photomicrograph of the product obtained with the smaller size cobalt seeding component at the same boron-to-silicon mole ratio, it is seen that the diameter of the whiskers formed is smaller than those formed in Example 4 but the concentration of whiskers is about the same.

EXAMPLE 13

Figure 13:
FIG. 13 is a scanning electron photomicrograph, at 1,000 times magnification, of the product formed in Example 13 illustrating the formation of silicon carbide whiskers by heating a mixture similar to that of Example 9 but having a boron-to-silicon mole ratio of 0.67.

The procedure of Example 9 was followed except 23.67 grams of boron oxide powder were used so that the boron-to-silicon mole ratio in the mixture subjected to blending was 0.67. A scanning electron photomicrograph of a portion of the resultant product at 1,000 times magnification is set forth in FIG. 13 and, when compared to FIG. 12, shows a relatively high concentration of straight whiskers having increased diameters in the product. A comparison of FIG. 13 with FIG. 5, the photomicrograph of the product obtained at the same boron-to-silicon mole ratio but with the smaller particle size cobalt seeding agent, shows whisker diameters and concentration approaching those obtained in Example 5.

EXAMPLE 14

Figure 14:
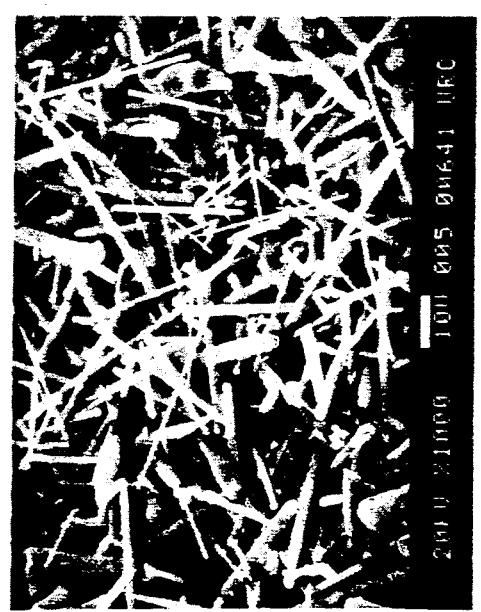
FIG. 14 is a scanning electron photomicrograph, at 1,000 times magnification, of the product formed in Example 14 illustrating the formation of silicon carbide whiskers by heating a mixture similar to that of Example 9 but having a boron-to-silicon mole ratio of 0.86.

The procedure of Example 9 was repeated except 30.43 grams of boron oxide powder were used so that the boron-to-silicon mole ratio in the mixture subjected to blending was 0.86. A scanning electron photomicrograph of a portion of the resultant product at 1,000 times magnification is set forth in FIG. 14 and shows whiskers of similar diameter to those obtained in Example 13. It appears from the figure that residual particles of borosilicate glass are present, and therefore the overall concentration of silicon carbide whiskers in the as-synthesized product is not quite as high as in the product of Example 13. A comparison of FIG. 14 with FIG. 6, the photomicrograph of the product obtained using the smaller particle cobalt seed at the same boron-to-silicon mole ratio, shows whiskers of about the same diameter, essentially no curly whiskers and what appears to be a lower concentration of borosilicate glass particulates. This lower concentration of borosilicate glass is believed to be the result of the increased concentration of carbon in the feed mixture as compared to Example 6. The extra carbon reacts with more silica to form whiskers, thereby leaving less silica in the form of residual borosilicate glass.

EXAMPLE 15

Figure 15:
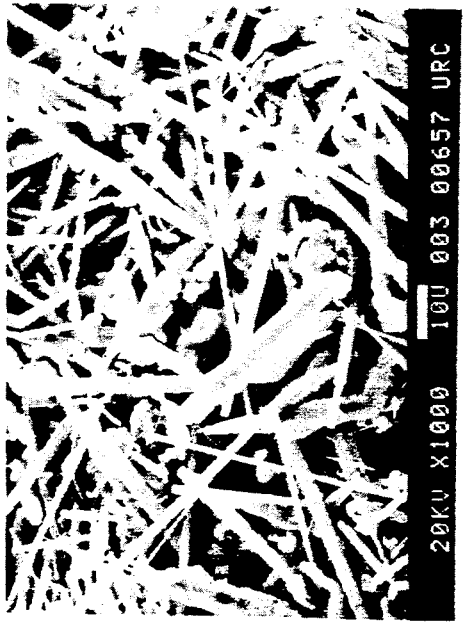
FIG. 15 is a scanning electron photomicrograph, at 1,000 times magnification, of the product formed in Example 15 illustrating the formation of silicon carbide whiskers by heating a mixture similar to that of Example 9 but having a boron-to-silicon mole ratio of 1.08.

The procedure of Example 9 was followed except 38.24 grams of boron oxide powder were used so that the boron-to-silicon mole ratio in the mixture subjected to blending was 1.08. A scanning electron photomicrograph of a portion of the resultant silicon carbide-containing product at 1,000 times magnification is shown in FIG. 15 and indicates the presence of rather large diameter straight whiskers which, because of a large increase in the amount of residual borosilicate glass formed, are present in a concentration less than that obtained in Example 14. Also, some of the whiskers appear to contain coatings of the borosilicate glass. When FIG. 15 is compared with FIG. 7, the photomicrograph of the product from Example 7 using the smaller particle cobalt seeding material at the same boron-to-silicon mole ratio, it is seen that there is little difference between the size, shape and concentration of whiskers.

EXAMPLE 16

Figure 16:
FIG. 16 is a scanning electron photomicrograph, at 1,000 times magnification, of the product formed in Example 16 illustrating the formation of silicon carbide whiskers by heating a mixture similar to that of Example 9 but having a boron-to-silicon mole ratio of 1.33.

The procedure of Example 9 was repeated except that 47.32 grams of boron oxide powder were used so that the boron-to-silicon mole ratio in the mixture subjected to blending was 1.33. A scanning electron photomicrograph of a portion of the product at 1,000 times magnification is shown in FIG. 16 and indicates that the as-synthesized product contained a very low concentration of whiskers and a high concentration of borosilicate glass, some of which appears as a coating on the whiskers. A comparison of FIG. 16 with FIG. 8, the photomicrograph of the product obtained in Example 8 using the smaller particle cobalt seed at the same boron-to-silicon mole ratio, shows about the same results, i.e., a low concentration of whiskers and a relatively high concentration of borosilicate glass.

A comparison of FIGS. 9 through 16 indicates, as did a comparison of FIGS. 1 through 8, that the optimum concentration of whiskers in the as-synthesized product appears to occur when the boron-to-silicon mole ratio in the feed mixture is between about 0.35 and 0.86. A boron-to-silicon mole ratio below 0.22 results in an undesirably high concentration of silicon carbide particulates while a boron-to-silicon mole ratio above 1.08 yields large concentrations of residual borosilicate glass. FIGS. 9 through 16 also indicate that the use of a coarser cobalt seeding material results in fairly uniform production of straight whiskers as opposed to the curly whiskers obtained when the smaller size cobalt seeds were used in Examples 1 through 8. It would appear, when comparing the results of Examples 1 through 8 with those of Examples 9 through 16, that the smaller cobalt seeds used in Examples 1 through 8 tend to yield a greater concentration of whiskers at an identical boron-to-silicon mole ratio as long as the mole ratio is below 0.86. This is evidently due to the presence in the smaller seeds of a larger number of nucleation sites for the growth of whiskers. Also, the results of Examples 9 through 16 indicate that, when a larger size cobalt seeding component is used, the diameter of the whiskers produced increases as the concentration of boron increases. This is in contrast to the results obtained with the smaller seeds where the diameter decreases and then increases with increasing boron concentrations.

It can be seen from the results of Examples 1 through 16 that the concentration, shape and size of silicon carbide whiskers obtained by the process of the invention can be controlled by adjusting the concentration of boron and the size of the seeding component used in the feed. It appears from the examples that the optimum concentration of primarily straight whiskers is obtained utilizing a boron-to-silicon mole ratio ranging between about 0.30 and 0.70 when the seeding component has a weight average particle size ranging between about 38 and 45 microns.

Although this invention has been primarily described in conjunction with examples and by reference to embodiments thereof, it is evident that many alternatives, modifications and variations will be apparent to those skilled in the art in light of the foregoing description. Accordingly, it is intended to embrace within the invention all such alternatives, modifications and variations that fall within the spirit and scope of the appended claims.

We claim:

1. A process for making silicon carbide whiskers which comprises heating in a substantially nonoxidizing atmosphere a mixture of (1) a particulate form of carbon, (2) a silicon component selected from the group consisting of silica, hydrated silica and a source of silica, (3) a boron component, and (4) a seeding component comprising (a) an element selected from the group consisting of the rare earths, Group IA, Group IB, Group VB, Group VIB, Group VIIb, and Group VIII of the Periodic Table of Elements, or (b) a compound containing said element at temperatures sufficient to induce a reaction between carbon and silica in said mixture to form silicon carbide whiskers and controlling a size and shape of silicon carbide whiskers produced by the process by selecting a particulate size of the seeding component.

2. A process as defined by claim 1 wherein said particulate form of carbon is selected from the group consisting of activated carbon, carbon black, petroleum coke and graphite powder.

3. A process as defined by claim 1 further comprising the step of controlling the size and shape of the produced silicon carbide whiskers by selecting a concentration of the boron component.

4. A process as defined in claim 1 wherein said particulate form of carbon has a weight average particle size between about 1 and 1,000 nanometers.

5. A process as defined by claim 1 wherein said silicon component is silica selected from the group consisting of fumed silica and silica glass powder.

6. A process as defined by claim 1 wherein said silicon component is a source of silica.

7. A process as defined by claim 1 wherein said silicon component is a hydrated silica selected from the group consisting of silicic acid, silica sols and silica gels.

8. A process as defined by claim 3 wherein said silicon component is fumed silica.

9. A process as defined by claim 1 wherein said boron component is selected from the group consisting of boron oxide, boric acid and organoboron compounds.

10. A process as defined by claim 8 wherein said boron component is boron oxide.

11. A process as defined by claim 1 wherein said seeding component comprises an element selected from the group consisting of potassium, rubidium, neodymium, vanadium, chromium, manganese, iron, cobalt, nickel and copper, or a compound containing said element.

12. A process as defined by claim 10 wherein said seeding component comprises an element selected from the group consisting of cobalt, nickel, and iron, or a compound containing said element.

13. A process as defined by claim 10 wherein said seeding component is cobalt metal.

14. A process as defined by claim 1 wherein the mole ratio of boron-to-silicon in said mixture is between about 0.15 and 1.0.

15. A process as defined by claim 1 wherein a sufficient amount of said seeding component is present in said mixture such that the mole ratio of said element to the silicon in said mixture is between about 0.001 and about 0.20.

16. A process as defined by claim 15 wherein said mole ratio is between about 0.01 and 0.20.

17. A process as defined by claim 1 wherein said seeding component is in the form of a metal.

18. A process as defined by claim 1 wherein said seeding component is a compound in the form of an oxalate, a carbonate, a silicide, a carbide, a sulfide, a nitrate, a nitride, an oxide, a boride, a silicate, a sulfate, a phosphide, a phosphate or a halide.

19. A process as defined by claim 1 wherein the weight average particle size of said seeding component is between about 0.10 and 200 microns.

20. A process as defined by claim 1 wherein said mixture is heated at a temperature above about 1300° C.

21. A process as defined by claim 1 wherein said mixture of said particulate form of carbon, said silicon component, said boron component, and said seeding component is subjected to a vacuum prior to said heating step.

22. A process for producing silicon carbide whiskers which comprises:
   (a) forming a mixture of carbon black, silica, boron oxide, and a seeding component comprising an element selected from the group consisting of cobalt, nickel, and iron, or a compound of said element;
   (b) heating said mixture in a substantially nonoxidizing atmosphere at temperatures sufficiently above about 1300° C. to induce the reaction of carbon with silica to form silicon carbide whiskers;
   (c) controlling a size and shape of silicon carbide whiskers produced by the process by selecting seeding component having a weight average particle size between about 0.10 and about 3.0 microns; and
   (d) recovering a product containing silicon carbide whiskers having the controlled size and shape.

23. A process as defined by claim 22 further comprising the step of controlling the size and shape of the produced silicon by adjusting a concentration of boron in said mixture, a mole ratio of boron-to-silicon in said mixture being between about 0.20 and about 0.90.

24. A process as defined by claim 23 wherein a sufficient amount of said seeding component is present in said mixture such that the mole ratio of said element to the silicon in said mixture is between about 0.01 and 0.15.

25. A process as defined by claim 24 wherein said silica is fumed silica.

26. A process as defined by claim 25 wherein said seeding component is cobalt metal.

27. A process as defined by claim 26 wherein the weight average particle size of said carbon black is between about 5 and 100 nanometers.

28. A process as defined by claim 27 wherein the weight average particle size of said cobalt metal is between about 0.5 and 2.0 microns.

29. A process as defined by claim 28 wherein the mole ratio of carbon-to-silicon in said mixture is between about 2.5 and 5.0.

30. A process as defined by claim 29 wherein said mixture is heated at a temperature between about 1500° C. and 1800° C.

31. A process as defined by claim 30 wherein greater than about 50 weight percent of the whiskers in said recovered product have a curly shape.

32. A process for producing silicon carbide which comprises:
   (a) forming a mixture of carbon black, silica, boron oxide, and a seeding component comprising an element selected from the group consisting of cobalt, nickel, and iron, or a compound containing said element;
   (b) heating said mixture in a substantially nonoxidizing atmosphere at temperatures sufficiently above about 1300° C. to induce the reaction of carbon with silica to form silicon carbide whiskers;
   (c) controlling a size and shape of silicon carbide whiskers produced by the process by selecting seeding component having a weight average particle size between about 3.0 and about 200 microns; and
   (d) recovering a product containing silicon carbide whiskers having the controlled size and shape.

33. A process as defined by claim 32 further comprising the step of controlling the size and shape of the produced silicon by adjusting a concentration of boron in said mixture, a mole ratio of boron-to-silicon in said mixture being between about 0.35 and about 1.0.

34. A process as defined by claim 33 wherein a sufficient amount of said seeding component is present in said mixture such that the mole ratio of said element to silicon in said mixture is between about 0.01 and 0.15.

35. A process as defined by claim 34 wherein the weight average particle size of said seeding component is between about 5.0 and 100 microns.

36. A process as defined by claim 35 wherein said silica is fumed silica.

37. A process as defined by claim 36 wherein said seeding component is cobalt metal.

38. A process as defined by claim 37 wherein the carbon-to-silicon mole ratio in said mixture is between about 2.5 and 5.0.

39. A process as defined by claim 38 wherein the weight average particle size of said carbon black is between about 5 and 100 nanometers 40. A process as defined by claim 39 wherein greater than about 80 weight percent of the whiskers in said recovered product have a relatively straight shape.

41. A process as defined by claim 6 wherein said source of silica is a silane.

* * * * *